US006489707B1

(12) United States Patent
Guerrero

(10) Patent No.: US 6,489,707 B1
(45) Date of Patent: Dec. 3, 2002

(54) METHOD AND APPARATUS FOR GENERATING ACOUSTIC ENERGY

(75) Inventor: Hector N. Guerrero, Evans, GA (US)

(73) Assignee: Westinghouse Savannah River Company, Aiken, SC (US)

( * ) Notice: Subject to any disclaimer, the term of this patent is extended or adjusted under 35 U.S.C. 154(b) by 0 days.

(21) Appl. No.: 09/493,853

(22) Filed: Jan. 28, 2000

(51) Int. Cl.[7] .......................... H01L 41/04; H01L 41/08; H01L 41/18; H02N 2/00

(52) U.S. Cl. ......................... 310/334; 310/335; 310/369

(58) Field of Search .................................. 310/335, 334, 310/369

(56) References Cited

U.S. PATENT DOCUMENTS

| | | | | | |
|---|---|---|---|---|---|
| 4,155,065 A | * | 5/1979 | Stimler | ........................ | 367/149 |
| 4,691,724 A | | 9/1987 | Garcia et al. | ................ | 134/169 |
| 4,697,195 A | * | 9/1987 | Quate et al. | .................. | 347/46 |
| 4,983,189 A | | 1/1991 | Peterson et al. | ............... | 55/15 |
| 5,192,450 A | | 3/1993 | Heyman | ...................... | 210/748 |
| 5,395,592 A | | 3/1995 | Bolleman et al. | ........... | 422/128 |
| 5,658,534 A | | 8/1997 | Desborough et al. | ....... | 422/128 |

* cited by examiner

*Primary Examiner*—Brian Sircus
*Assistant Examiner*—Michael C. Zarroli
(74) *Attorney, Agent, or Firm*—J. Herbert O'Toole; Nexsen Pruet Jacobs & Pollard, LLC

(57) ABSTRACT

A method and apparatus for generating and emitting amplified coherent acoustic energy. A cylindrical transducer is mounted within a housing, the transducer having an acoustically open end and an acoustically closed end. The interior of the transducer is filled with an active medium which may include scattering nuclei. Excitation of the transducer produces radially directed acoustic energy in the active medium, which is converted by the dimensions of the transducer, the acoustically closed end thereof, and the scattering nuclei, to amplified coherent acoustic energy directed longitudinally within the transducer. The energy is emitted through the acoustically open end of the transducer. The emitted energy can be used for, among other things, effecting a chemical reaction or removing scale from the interior walls of containment vessels.

22 Claims, 4 Drawing Sheets

METHOD AND APPARATUS FOR GENERATING ACOUSTIC ENERGY

The United States Government has rights in this invention pursuant to contract number DE-AC09-89-SR18035 between the U.S. Department of Energy and Westinghouse Savannah River Company.

FIELD OF THE INVENTION

This invention relates to acoustical devices and methods, and to the manipulation of acoustical energy. More particularly, the invention relates to a SASER (Sound Amplification by the Stimulated Emission of Radiation), the acoustic analogue of the laser. The method and apparatus of the invention enable the directional emission of amplified, coherent sound waves.

BACKGROUND OF THE INVENTION

The fundamentals of acoustics, sometimes referred to as vibrational energy, have long been studied and understood. At its simplest, the field of acoustics concerns the propagation through a medium of a series of pressure waves. The wavelength, frequency, and speed of the waves can be measured and correlated. The most familiar form of acoustic energy to humans is perceived sound. The term in general, and specifically as used herein, however, refers to the entire spectrum of this type of energy.

Acoustics, especially at ultrasonic frequencies, are finding an increased number of uses in a widening array of fields. Ultrasonic devices are used for cleaning, such as removing scale or other contamination from surfaces. Ultrasound is also being used to effect certain chemical processes in a field sometimes referred to as sonochemistry.

A method of using ultrasonic energy for separating the constituents of a mixture, referred to as acoustophoresis, is set forth in U.S. Pat. No. 5,192,450, issued to Heyman. According to the disclosure, an acoustic wave is transmitted at one end of a container to a sample therein via a transducer at ultrasonic frequencies. The wave can be "tuned" to the resonance of a desired constituent, forcing the constituent to one end of the container for separation. This methodology requires that the acoustic wave be propagated throughout the container, requiring either a relatively small sample size or prohibitive amounts of energy.

Separation using ultrasonic means is also the subject of U.S. Pat. No. 4,983,189, issued to Peterson et al. The discussion and disclosure therein concerns the use of ultrasonic frequencies to establish standing waves in a medium. Particles in the medium, depending on a number of characteristics such as resonance, size, and composition, will migrate toward the regions of highest pressure in the standing wave or to the regions of lowest pressure in the standing wave. In standard nomenclature, adopted herein, a region of high pressure is termed an antinode and a region of low pressure is termed a node. This separation technique, sometimes also called acoustophoresis, requires that the entirety of the sample be subject to the standing wave, or waves, to effect separation. Again, this limits the method to relatively small sample sizes or large expenditures of power.

A fairly common use of ultrasonic energy is cleaning surfaces. It is believed that the cleaning is accomplished largely through a process known as cavitation. Cavitation is the creation and rapid collapse of relatively small voids in a medium subjected to acoustic energy at ultrasonic frequencies. While not all aspects of cavitation are fully understood, it is believed that this phenomenon causes extremely high and transient temperatures and pressures. An intense, highly localized, shock wave is also created.

These effects, although occurring over only a very small area for each void created and destroyed, can be very destructive. Cavitation is therefore a very useful way to clean a relatively hard surface of such accretions as scale and alga without damaging the surface. Because acoustic energy can essentially permeate a medium, the technique is also useful for surfaces which because of size, location, or intricacy are difficult to reach.

One prior art device that can be used for cleaning surfaces is disclosed in U.S. Pat. No. 4,691,724 to Garcia et al. This patent discloses a probe which can be lowered into a medium. The intention can either be to clean the surfaces of the vessel containing the medium, or to clean objects within the vessel. Garcia et al. describe a means by which both longitudinal and radial waves can be generated by the probe. The probe contains a piezoceramic transducer, which vibrates in response to input from a tunable power source to produce ultrasonic waves in the medium.

Generating controlled radial and longitudinal waves, according to the disclosure, produces surface-cleaning cavitation more efficiently and throughout a greater volume of medium. With this device also, the entire medium must be permeated, especially to reach and clean the walls enclosing the medium. The radial waves at least are generated omnidirectionally around the circumference of the probe such that for any given surface area, only a fraction of the energy input is effective at that area.

In recent years, theoretical attention has been paid to the physics of a SASER, the acoustic equivalent of the well-known laser. The known literature, however, does not disclose a functional, practicable apparatus or method of embodying the proposed physics. Such an apparatus and method, useful for solving the problems with existing acoustic equipment as set forth above, has thus been long-sought in the art.

SUMMARY OF THE INVENTION

It is an object of this invention to provide an apparatus and a method for concentrating acoustic energy and emitting it as a narrow beam of single frequency sound waves.

It is another object of this invention to provide an apparatus and method for greatly increasing the efficiency of the transduction of electrical energy to acoustic energy.

It is a further object of this invention to provide an acoustic laser, or SASER, capable of emitting concentrated pressure waves at a single frequency into a medium.

It is yet another object of this invention to provide a highly efficient means of projecting directional sound waves into and through a suitable medium.

It is still another object of this invention to provide a means for inducing cavitation within a medium along a specified path or at a specified location.

These and other objectives are achieved by means of an acoustic apparatus having a housing having an opening, a hollow cylindrical transducer mounted in the housing, the transducer having a first and a second end, the first end of the transducer being aligned with the opening in the housing and the second end being closed by a rigid wall, an acoustically conductive active medium filling said transducer, and a power supply operatively connected to the transducer capable of exciting the transducer to produce acoustical energy in the active medium.

DETAILED DESCRIPTION OF THE INVENTION

Figure 1:
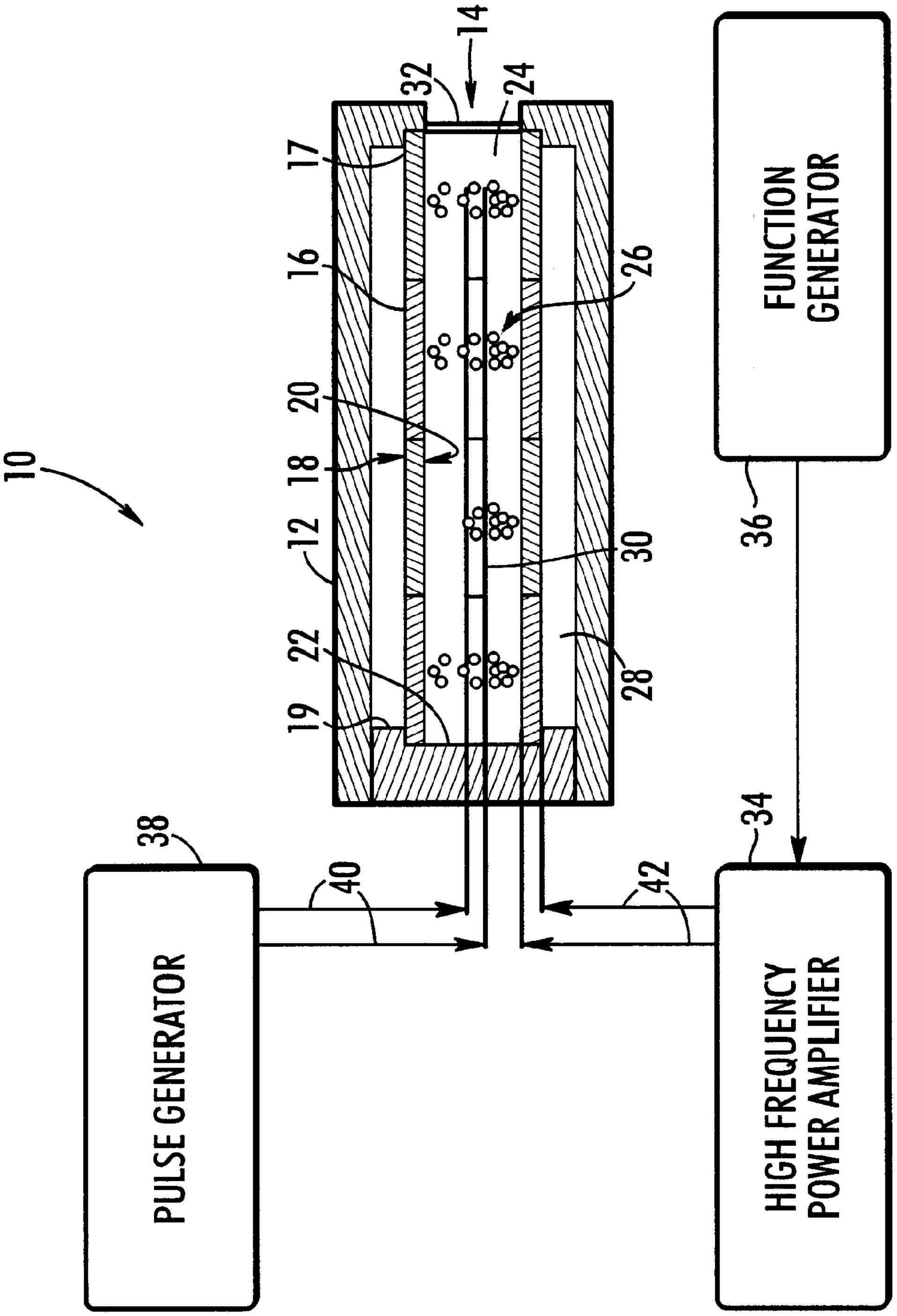
FIG. 1 is a diagrammatic side cross-section of one preferred embodiment of a SASER according to the current invention.

The acoustic devices existing in the art, and especially the ultrasonic devices used for cleaning surfaces and in applications sometimes referred to as sonochemistry and acoustophoresis, are not highly efficient. Typically, a transducer such as a flat plate is mechanically or electrically vibrated at the desired frequency, using tuned or tunable power sources and amplifiers known in the art, inducing acoustical waves in a medium to be affected.

In such uses as for sonochemistry or acoustophoresis, the entire medium must be saturated with the energy in order to achieve the desired results. Thus, either the sample size must be limited, or transducers must be used that are prohibitively expensive.

In a cleaning device, such as the probe discussed above, it is also true that, to be effective, the entire medium must be affected to clean all of the interior surfaces. The probe as disclosed in U.S. Pat. No. 4,691,724, emits waves longitudinally and radially. The radial waves are omnidirectional. If only a portion of a surface is to be subjected to the acoustic energy, only the radial waves emitted along a small arc will impact the surface. The remaining waves will only uselessly dissipate energy in the medium. Again, the limitations imposed by efficiency and size are present.

In stark contrast to devices now found in the art, this invention provides an acoustic laser, or SASER, to concentrate and constructively amplify acoustic energy and emit it at a single frequency along a single axis. This greatly increases the efficiency of the apparatus, both in the production and the use of the acoustic energy. The energy may be accurately directed at a desired target, such as an acoustic receiver for the purpose of underwater communications or a selected surface of a containment vessel for cleaning the surface.

A. The SASER Apparatus

The apparatus and method of the current invention can readily understood by reference to the drawings. For clarity of reference, components which are similar are similarly numbered in the drawings.

FIG. 1 shows a diagrammatic, cross-sectional lay-out of a SASER according to the current invention. There is a housing 12 which, although shown in cross-section here, is intended to completely enclose other components of the SASER. The housing 12 has at least one opening, indicated at opening 14. Other openings or conduits may be made in housing 12 to permit the passage of wires or other components. Housing 12 is intended to be constructed so that it may be entirely immersed in a medium without resultant damage to either housing 12 or the components within. The medium referred to here includes any medium into or through which acoustic energy is to be transmitted from the SASER. The construction of housing 12 may depend on whether the medium is relatively benign, such as air or water, or is a relatively corrosive gas, liquid, or other media. Alternatively, only a portion of housing 12 near opening 14 may be made to be immersible. The immersible portion, or all, of housing 12 should be constructed so as to be able to chemically and mechanically withstand the medium in which it will be immersed.

Mounted within housing 12 is a hollow, cylindrical tube 16 which comprises a transducer. Tube 16 may be a single integral component, or may be a plurality of smaller tubes connected end to end to form a longer tube, cemented end to end by, for example, epoxy. As with the housing 12, tube 16 shown in FIG. 1 is intended to be a complete cylinder. The transducer as represented by tube 16, and its functioning, are more fully described below under Function and Method. The tube 16 may be made of any material which can be induced to vibrate in a radial direction. Preferred materials are piezoceramic or magnetostrictive materials and, in particular, $PbZrTiO_2$, barium titanate, or quartz. In the embodiment shown in FIG. 1, the tube 16 is a piezoelectric ceramic (piezoceramic) material. Tube 16 has a circular outer surface 18 and a circular inner surface indicated at 20. In at least the case of a piezoceramic transducer, outer surface 18 and inner surface 20 of tube 16 have been silvered, or coated with another conductive material, and tube 16 is subjected to a high voltage to polarize it for use as a transducer.

Tube 16 is open at one end, generally indicated at 17. In this context, the fact that tube 16 is open means acoustically open, that is, that pressure waves of the frequency at which the SASER will be operated will be emitted from open end 17. Tube end 17 is aligned with opening 14 in housing 12. The other end of tube 16, generally indicated at 19, is closed by a rigid wall 22. Wall 22 may be part of tube 16 itself, part of housing 12, or separate from both. By "rigid" is meant that wall 22 is at least substantially acoustically impervious at the acoustic frequency at which the SASER will be operated. Preferably, rigid wall 22 is acoustically reflective, at least at the frequencies at which the SASER is intended to operate.

Enclosed within tube 16 is an active medium 24. Active medium 24 is preferably a liquid and, for reasons of efficiency and cost, most preferably water. Active medium 24 can be, however, any substance through which acoustic energy can be transmitted. Because housing 12, or at least opening 14, are to be immersed in a working medium, open end 17 of tube 16 may be physically as well as acoustically open if the working medium is suitable as an active medium. Where for any number of reasons it is desired to physically close off open end 17 to physically isolate active medium 24 from the working medium, as when the two media are of different types, an acoustically transparent diaphragm 32 across open end 17 will maintain the desired separation. Diaphragm 32 may be of thin metal, or of any acoustically transparent substance that is chemically impervious to both active medium 24 and the working medium. In its most preferred form, diaphragm 32 is acoustically "semi-transparent," that is, it allows and/or aids in transmitting acoustic energy from active medium 24 and partially reflects the acoustic energy within active medium 24 to concentrate the acoustic energy. In this form, diaphragm 32 is analogous, with respect to acoustic energy, to the semi-transparent, semi-reflective light transmitting end of a laser, which performs the same functions of transmitting and amplifying.

Within the active medium 24 are scattering nuclei 26, the function of which is discussed more fully below in the section Function and Method. Scattering nuclei can be made of any compressible substance, including compressible particulates such as hollow microspheres, plastic beads or particles, or air bubbles. In the case of plastic particulates, suitable types include but are not limited to polyethylene, polystyrene, and polytetrafluoroethylene (PTFE). Hollow microspheres of phenolic or any other plastic material having elastic properties are particularly preferred because of advantageous properties discussed below.

In one preferred embodiment of the SASER in FIG. 1, scattering nuclei 26 are generated by the hydrolytic effect on active medium 24 of one or more electrodes 30. An electrode pair 30 is mounted within tube 16 so as to lie substantially along the central, longitudinal axis thereof Electrode pair 30 is connected to a power source such as pulse generator 38 by connecting wires indicated at 40. When current from pulse generator 38 flows through electrode pair 30, the active medium 24 is hydrolyzed to produce bubbles, which in turn function as scattering nuclei 26. Electrode pair 30 can be constructed so as to be electrically exposed along the length thereof to active medium 24, but is preferably insulated to be electrically exposed to active medium 24 at predetermined points along the length of tube 16, thus preferentially producing bubbles as scattering nuclei 26 at such predetermined points. This aids in locating the scattering nuclei 26 at or near the nodal points of the acoustic energy to be generated. Alternatively, a single electrode can be mounted so as to be within the active medium 24, with current being generated between the mounted electrode 30 and the electrical power feed to tube 16.

In the preferred embodiment of FIG. 1 where tube 16 is piezoceramic material, tube 16 is induced to act as a transducer. To accomplish this, outer surface 18 and inner surface 20 of tube 16 are electrically connected to a power supply by any conventional means. One such means is by wires, illustrated at 42, which are soldered, brazed, or otherwise electrically connected to the respective surfaces of tube 16.

Wires 42 are operatively connected to a power source, which in a preferred embodiment comprises a high-frequency power amplifier 34 and a function generator 36. Associated electronics and controls for the power source are not shown, but are known to those in the art. Function generator 36 is used to generate a wave form to condition amplifier 34, which in turn supplies a tuned, high-frequency current through wires 42 to tube 16. The effect of the power on the piezoceramic tube 16 is to cause it to vibrate radially at the desired frequency. This radial vibration is transmitted to and through active medium 24 and produces single-frequency, concentrated acoustic waves which are emitted longitudinally from tube 16 through opening 14, as is further described below.

In a preferred embodiment, tube 16 is mounted within housing 12 such that an annular space 28 completely surrounds tube 16. The annular space 28 is intended to act as an insulator so that acoustic energy that has been induced in active medium 24 is not dissipated. In a preferred embodiment, annular space 28 is filled with air, but it can be filled with any substance which will act as an acoustic insulator at the frequencies at which the SASER will operate. The substances used for tube 16, housing 12, and/or active medium 24 will determine what acoustical insulator should be used in annular space 28.

Figure 2:
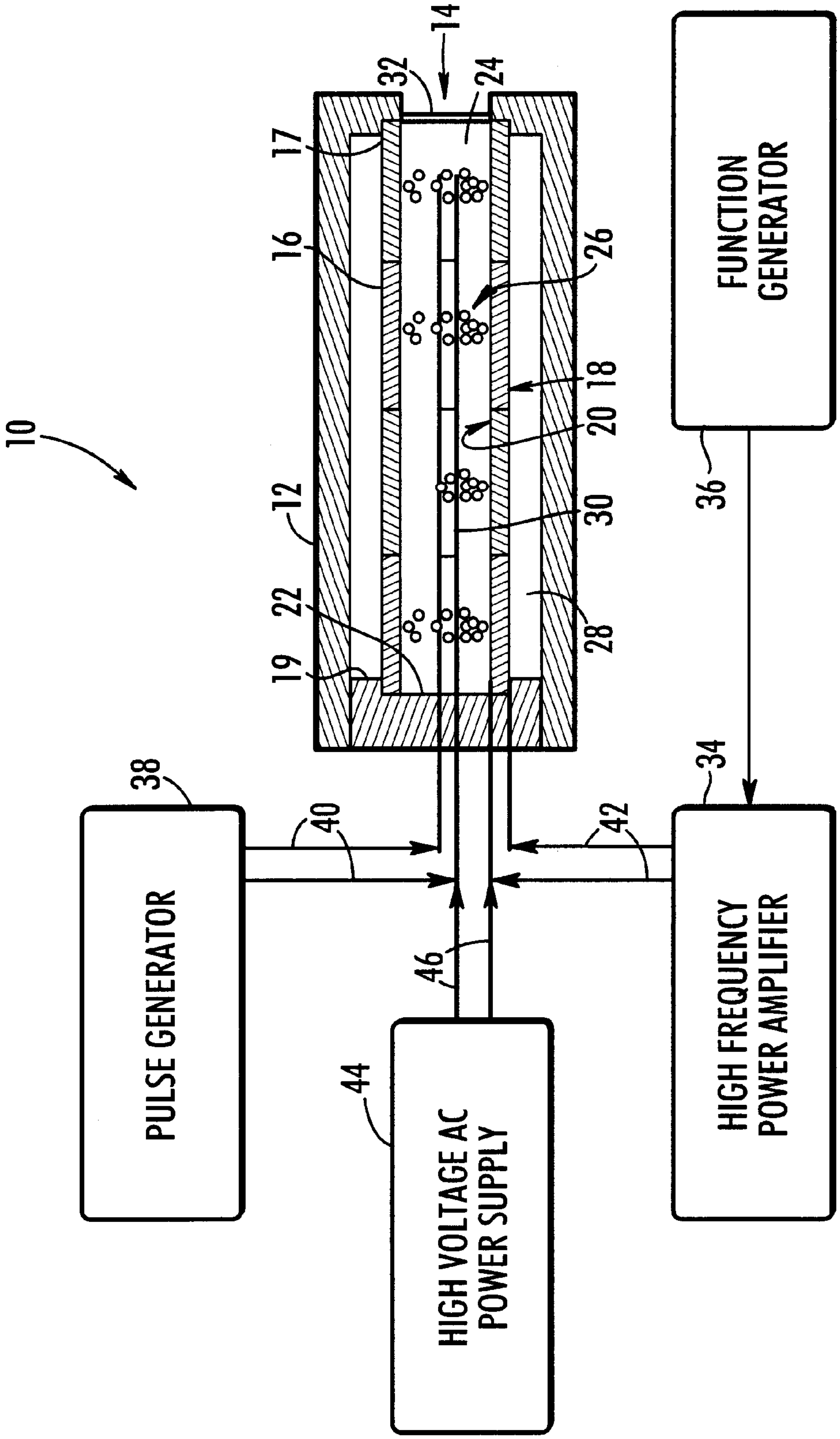
FIG. 2 is a diagrammatic side cross-section of another preferred embodiment of a SASER according to the current invention.

FIG. 2 shows another preferred embodiment of the SASER according to this invention. Like elements are indicated by like numbers. Thus there is a housing 12 with an opening 14. Mounted within housing 12 is a tube 16 with an open end 17 aligned with opening 14. A rigid wall 22 closes end 19 of tube 16. Tube 16 contains an active medium 24 which can be contained within tube 16 by diaphragm 32. An electrode pair 30 is connected to a power source in the form of pulse generator 38.

In this embodiment of the invention, tube 16 is not simply a cylinder or a series of connected cylinders. Instead, it is constructed as is explained with reference to FIGS. 3–5. Thus, although in this embodiment there is still a power source comprising a function generator 36 and a high-frequency power amplifier 34, wires 42 are not simply connected to inner surface 20 and outer surface 18 of tube 16, but are operatively connected to tube 16 so as to enable the power supply to induce tube 16 to generate acoustical energy within active medium 24.

In the embodiment shown in FIG. 2, there is also a high voltage alternating current supply 44. Power supply 44 is connected by wires 46 to one electrode of electrode pair 30 and to a conductive portion of inner surface 20 of tube 16. The purpose of power supply 44 and the manner in which it is connected is explained below in Function and Method.

Figure 3:
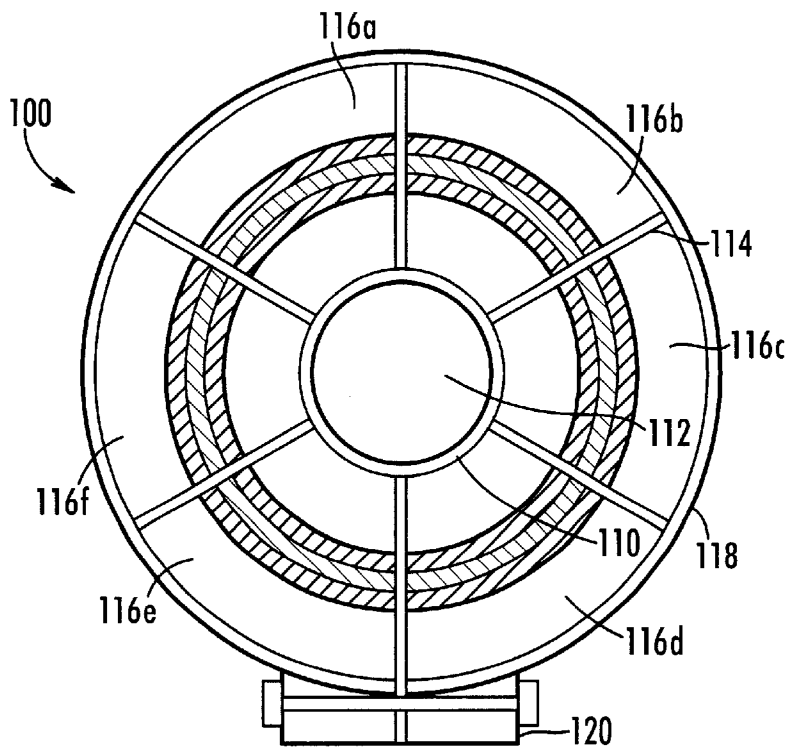
FIG. 3 is a diagrammatic end-on cross-section illustrating the basic components of a multi-component transducer constructed according to a preferred embodiment of the invention.
Figure 4:
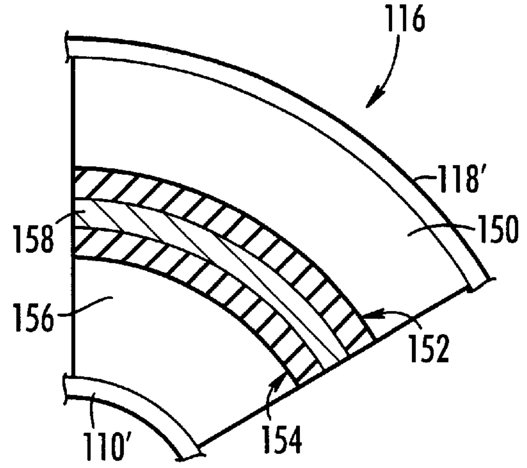
FIG. 4 is a schematic of one portion of the multi-component transducer of FIG. 3.

FIGS. 3 and 4 show another preferred embodiment for the transducer shown in FIGS. 1 and 2 as tube 16. In this embodiment the acoustic transducer comprises a plurality of arcuate "sandwich" transducers around a central tube. FIG. 3 shows an end-on cross-section of a preferred embodiment of this type of transducer. The transducer 100 comprises a central cylinder 110 which contains the active medium 112. As shown in FIGS. 1 and 2, cylinder 110 will be closed at one end by a rigid wall 22 and the other, acoustically open end will be aligned with opening 14 in housing 12.

In the embodiment illustrated in FIG. 3, cylinder 110 is surrounded by a plurality of arcuate transducing sectors 116*a*–116*f* In this embodiment, the sectors 116 are separate components and may be held slightly apart from each other, indicated in FIG. 3 by slot 114. At least one band 118 encircles sectors 116 to both hold them in place around cylinder 110 and to urge them against it. A lug 120 may be used to secure and tighten band 118. While the embodiment is illustrated using a band clamp, it is within the scope of the invention to use any of several clamping or securing means to hold sectors 116 and urge them against cylinder 110.

A single illustrative sector 116 is shown in FIG. 4. A portion of band 118 in FIG. 3 is shown at 118', and a portion of cylinder 110 in FIG. 3 is shown at 110'. There is shown a transducing layer 158. In a preferred embodiment of the invention, each transducing layer is a portion of a piezoelectric cylinder originally formed with the appropriate diameter. The cylinder is then cut lengthwise to form the arcuate sections that are used as transducing layers. Alternatively, each such transducing layer could be formed separately. Each transducing layer 158 is lined on its respective sides 152, 154 with a conductive material such as copper foil which in turn is operatively connected to a power supply (not shown) to induce vibration.

Transducing layer 158 is "sandwiched" between an outer portion 150 and an inner portion 156. Preferably, outer portion 150 and inner portion 156 are formed of metal and, after assembly of the section 116, the "sandwich" is prestressed. The two portions may be made of steel, aluminum, or other suitable material. Aluminum is a preferred material because it provides good coupling between the induced vibration of transducing layer 158 and active medium 112. Also, it is preferable that outer portion 150 be of a thickness such that the reactances of outer portion 150 and the piezoelectric material of transducing layer 158 cancel.

Each transducing sector 116 is then placed around tube 110 as shown in FIG. 3. The sectors are held in place and urged against tube 110 by band 118 and lug 120. While six sectors are shown in the transducer element 100 in FIG. 3, a greater or lesser number may be used depending on the application intended.

Figure 5:
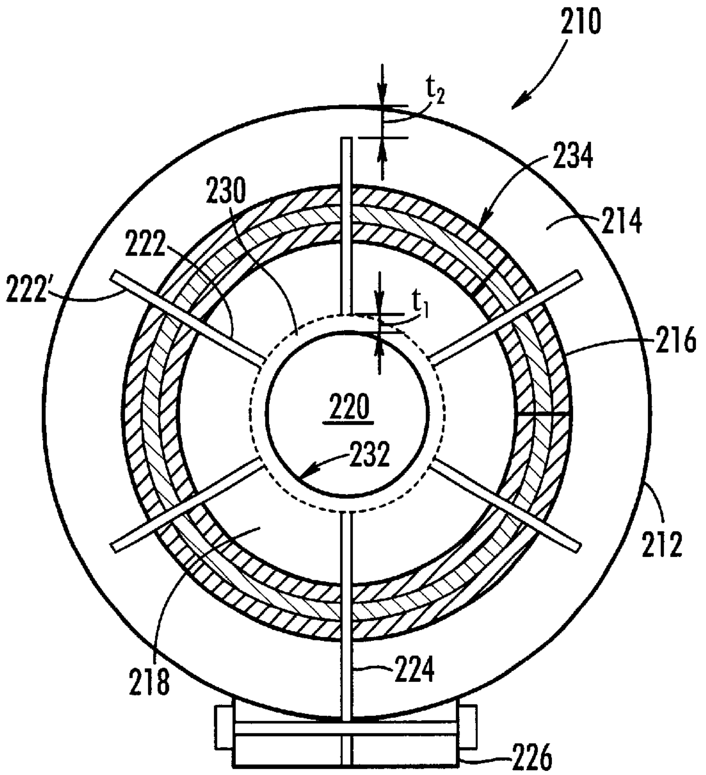
FIG. 5 is a diagrammatic end-on cross-section illustrating an alternate preferred embodiment of a multi-component transducer for use in the current invention.

An alternate preferred embodiment for a transducer element is shown as element 210 in FIG. 5. This embodiment, in general, also uses a sector construction as described above. In this embodiment, the inner and outer portions described for each sector with reference to FIGS. 3 and 4 are each an integral piece.

Referring to FIG. 5, the transducer element 210 has a plurality of arcuate transducing layers, one of which is indicated at 216. These layers can be constructed and connected to a power supply as described above with reference to FIGS. 3 and 4. The transducing layers 216 are mounted on a hollow inner slotted cylinder 218. Inner slotted cylinder 218 defines a tubular interior containing active medium 220. As described above, this tubular interior will be open at one end and closed by a rigid wall at the other.

A series of radially aligned slots, one of which is shown at 222, are formed or cut into the exterior surface of inner slotted cylinder 218. The number of slots 222 created will depend on the number of transducing layers 216. The slots should be made to a depth in inner slotted cylinder 218 such that a distance $t_1$ remains between the interior end of a slot 222 and the interior surface 232 of the tubular interior. The plurality of radially aligned slots 222 will define an inner tube indicated by the dashed line 230. This inner tube, while not forming a discrete physical component, will act as a tube having a thickness $t_1$ which is made equal to one-quarter of the wavelength of the acoustic energy to be transmitted by the SASER. As stated above, inner slotted cylinder 218 may be of steel or aluminum, with aluminum preferred for its characteristic of providing good coupling with active medium 220.

In the preferred embodiment of the transducer element shown in FIG. 5, outer slotted cylinder 214 is also an integral component. Outer slotted cylinder 214 defines an interior mating surface 234 having slots 222' positioned to line up with slots 222 on the exterior of inner slotted cylinder 218. The slots are radially aligned and extend from the interior mating surface 234 towards the exterior of outer slotted cylinder 214, leaving a thickness $t_2$ between the outer end of each slot 222' and the exterior of outer slotted cylinder 214. The thickness $t_2$ defines a backing cylinder 236 shown in FIG. 5 by broken line 238. Outer slotted cylinder 214 is preferably made of metal such as steel or aluminum, most preferably of aluminum.

One slot 224 in outer slotted cylinder 214 extends completely through the thickness of the cylinder. At the point of slot 224 is a lug 226 which can be tightened, thus causing outer slotted cylinder 214 to exert a radially inward pressure to ensure placement and stability of the transducing elements 216, and good contact and energy transmission between elements 216 and active medium 220.

Figure 6:
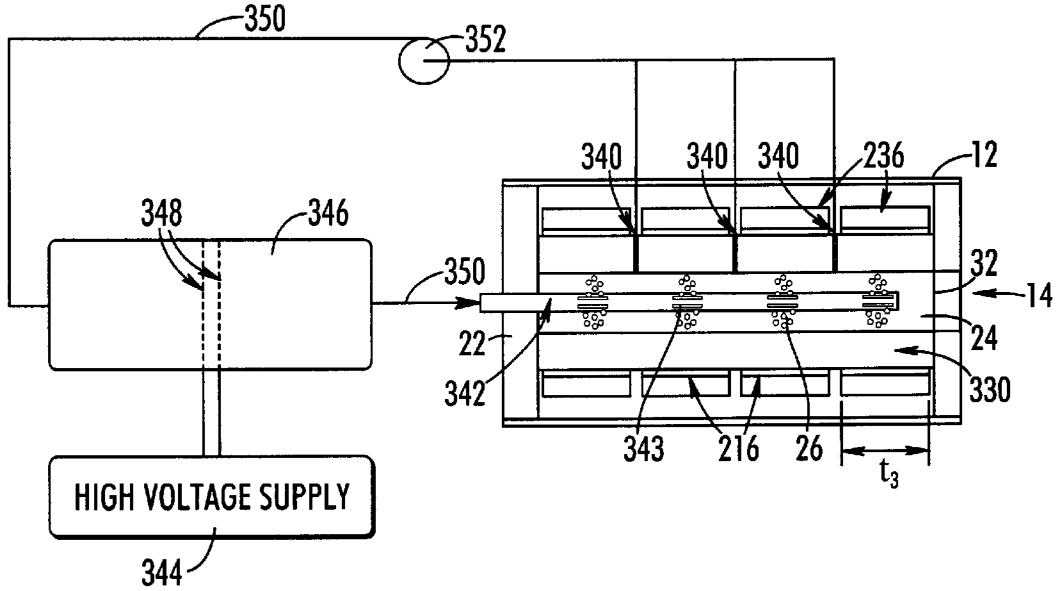

Still another preferred embodiment is shown in FIG. 6, in which like numbers designate the elements described in preceding figures. The embodiment shown in FIG. 6 illustrates an alternative means for providing scattering nuclei 26 in active medium 24. For the embodiment shown in this figure, the embodiment of the SASER and SASER cavity are as shown in FIG. 5. Inner cylinder 330 in FIG. 6 is the inner cylinder defined by line 230 in FIG. 5. In this embodiment, the scattering nuclei 26 are provided from a source outside the active medium 24.

In this illustrative embodiment, scattering nuclei in the form of gas bubbles are generated in bubble generator 346. The interior of bubble generator 346 is filled with a medium that will act as active medium 24, e.g., water. The bubbles are generated by hydrolysis caused by a current generated in electrodes 348, the current being supplied by high voltage supply 344.

Medium with the generated nuclei is pumped by the action of a pump 352 through conduit 350 as shown by the arrow. Conduit 350 is connected to a nuclei distributor 342. Nuclei distributor 342 may be a thin tube extending through a seal (not shown) in rigid wall 22 into the interior of inner cylinder 330. By the pumping action of pump 352, medium with scattering nuclei 26 are distributed within active medium 24 through nuclei slots 343. In the preferred form shown in FIG. 6, nuclei slots 343 are placed at predetermined spacings within inner cylinder 330 such that the scattering nuclei 26 are distributed at or close to the preferred acoustical antinodal points. Although this is preferred, nuclei distributor 342 may simply have one or more longitudinal slots through which nuclei 26 are introduced, the nuclei being forced to the correct antinodal points by the acoustic energy itself.

To maintain a constant flow of the medium as nuclei are introduced, one or more openings 340 are made entirely through backing cylinder 236, piezoelectric elements 216 and inner cylinder 330. These openings 340 allow medium to flow out of the interior through conduit 350, through pump 352 and back to the generator 346. Where the elements comprising the SASER are manufactured piecewise, having a longitudinal thickness $t_3$ as shown in FIG. 6, openings 340 can be conveniently placed between the segments. In an integral cylinder, openings 340 may be constructed by, e.g., drilling openings therein.

While this embodiment shows a bubble generator 346, other scattering nuclei 26 may be utilized in this embodiment. Where, for example, the scattering nuclei 26 are in the preferred form of hollow microspheres, bubble generator 346 may be replaced by a simple mixing chamber having, e.g., a mechanical stirring mechanism to keep the microspheres suspended in the medium. The suspended microspheres would be pumped via nuclei distributor 342 to act as scattering nuclei 26 in active medium 24. Other simple variations are possible utilizing other forms of scattering nuclei.

In still another embodiment, the interior chamber, that is, the central cavity filled with active medium 24, can be divided into sectors longitudinally. The dividers comprise one or more acoustically transparent membranes functioning to physically or chemically isolate sectors of the central cavity without affecting the propagation of acoustic energy therethrough. Such division into segments allows using two or more types of active media, as discussed below. Even if the active medium is homogeneous throughout, use of dividers can enhance the action of the scattering nuclei by restricting wide movement thereof. Furthermore, a segmented tube with scatterers provided from without, as exemplified in the embodiment of FIG. 6, allows the introduction into each segment of a controlled number and/or kind of scatterer by simple adjustments and additions to the nuclei generator and/or the nuclei distributor 342.

B. Function and Method

While the inventors are not to be bound to any particular theoretical construct for the working of the SASER, the theoretical aspects of the following description of the function of the SASER are believed to be supported by the existing literature.

The principle of the SASER may be summarized as the transformation of the radial acoustic waves generated by the radial vibration of a cylinder into a coherent axially propagating wave emanating from the end of the SASER. The coherent, amplified acoustic energy is reflected by one wall of the central cavity, e.g., rigid wall 22 described above, and emitted through the acoustically transparent end of the cavity. This provides a highly directional, highly concentrated "beam" of acoustic energy that can be utilized in a wide variety of applications.

As a first example, consider a SASER constructed in accordance with FIG. 1, wherein tube 16 is a piezoceramic cylinder. In this case, tube 16 is, as described, either an integral element or is constructed of more than one element joined together to form a single tube. The preferred frequency of the acoustic energy to be generated is a function of the diameter of the tube 16, and the tube should be constructed so as to resonate at the desired frequency. As an example, a typical tube 16 may have a 2.0 inch (5.08 cm) outer diameter with a length of about 6.0 inches (15.24 cm) and a wall thickness of about 0.125 inches (0.3175 cm). Such a tube 16 will have a natural frequency of about 20 kHz and the power supply comprising function generator 36 and high frequency power amplifier 34 should be made capable of supplying electrical input with a frequency at least up to the natural frequency of the tube 30. The length of tube 30 must be a half multiple of the wavelength of the supplied frequency.

Oscillating current is supplied by the power supply to the conductive inner and outer coatings of the tube. Due to the piezoelectric effect, the tube will in turn oscillate in a radial direction, that is, its diameter will increase and decrease. This creates a tensile stress and a tensile strain in the radial, or circumferential, direction.

Because the tube 16 is filled with an active medium 24, the tube will act as a transducer, creating pressure waves in the active medium which propagate radially towards and away from the center of the tube. Further, because one end of the tube is closed by an acoustically rigid wall 22, while the other end is acoustically open, a beam of acoustic energy will emanate from the open end.

If the waves inside the tube are coherent, that is, in phase and not destructively interfering with each other, the emitted beam will be a highly concentrated and highly directional beam of acoustic waves. This phenomenon can be promoted through the use of scattering nuclei in the active medium. The action of the scattering nuclei is discussed below.

A preferred alternative embodiment of the transducer element is illustrated in FIGS. 3–5 and 6. Because the layers are, or are shaped as if, cut from a cylinder, the summed vibrational energy will create radial waves in the active medium as discussed above. Because the individual transducers are not actually a cylinder, however, several advantages are realized.

The power that can be applied to and in turn transduced in a piezoceramic cylinder is subject to the tension limits of the material and the maximum displacement in the radial direction. Use of the "sandwich" transducer sections allows the transducers to be pre-compressed. This, plus the placement of the transducer layer between two preferably metal portions ensures that the tensile limits of the transducer are not exceeded. The two metal portions also ensure that the transducing layer is protected from any other stresses which may be imposed by the operation of the SASER or the environment in which it is used.

Also, although the net effect of all of the transducing sectors is a radial wave due to the arcuate shape of the transducing layers, each individual transducer is vibrating in a thickness mode rather than a radial mode. The transducing factor, that is, the electrical-to-mechanical transformation factor, is greater in the thickness mode than in the radial mode. This increases the amount of power that can be input to, and concentrated and directed by, the SASER.

The use of transducing sectors also allows greater flexibility in choosing the diameter of the tube containing the active medium. As discussed elsewhere herein, the dimensions of the tube can be of critical importance. Where the tube is itself the piezoelectric material, the natural resonance frequency of the tube is inversely proportional to the diameter of the tube, and where tube dimensions are of necessity constrained, the frequencies at which the SASER can operate are likewise constrained.

Where the radial elements of the SASER are arranged as exemplified in the embodiments shown in FIGS. 3–6, the resonant frequency of the SASER can be more easily predetermined, or "tuned." The inner cylinder depicted as defined by line 230 in FIG. 5 is constructed to have a thickness equal to one quarter of the frequency to be used. The thicknesses of the piezoelectric material, the backing cylinder and other elements are determined by the requirement that their respective acoustic impedancies cancel. In this construct, the resonance in the transducing sector to achieve efficient energy transfer is not dependent on the diameter of the central cavity, but is dependent only on the thicknesses of the sandwich and backing elements. Selection of the relevant thicknesses thus allows precise selection of the desired frequency.

Preferred mechanisms for converting the radially generated acoustic energy into axially propagated energy are now discussed. A preferred method is through the use of scatterers such as scattering nuclei 26. Another method involves creating distinct segments within the central cavity of the SASER with differing properties. Other methods may be used.

Scattering nuclei may be of any substance that is compressible. Air bubbles, hollow microspheres, or particulates such as plastic powder are preferred scattering nuclei. The radially directed waves created in the active medium by the transducer will cause the nuclei to contract and expand. Upon expansion, the nuclei emit waves in all directions, generating a wave component in the axial direction.

By ensuring that the nuclei, e.g., gas bubbles gather or bunch at the antinodes of the axial wave, the axial waves will undergo constructive addition. The result of the constructive addition is a concentrated, coherent axial beam. The acoustic radiation force in the active medium will cause the nuclei to bunch at the wave antinodes if the nuclei are sized to be smaller than the resonant nuclei size.

While compressible particulates are useful in certain applications and may in fact be preferred in, e.g., non-aqueous active media, a preferred method of creating scattering nuclei in the active medium is by hydrolysis of the medium. The pair of electrodes 30 in FIG. 1 show one preferred apparatus for producing bubbles. If the electrodes are conductively exposed along the length thereof, bubbles will be produced at all points and will bunch at the antinodes as illustrated in FIG. 1. Preferably, the locations of the antinodes within the tube may be precalculated, and the electrodes selectively conductively exposed at or near these locations. This latter construction enhances the start up of the pressure wave coherence.

The pulse generator (38 in FIG. 1) is preferably a high voltage generator. The voltage peak and pulse width of the current generated by the generator determine the size of the bubbles produced, allowing an operator to carefully control the scattering nuclei size. The pulses produced should most preferably have very sharp rise and fall times such that small bubbles of uniform size are produced.

An alternative embodiment of the SASER as shown in FIG. 2 also includes a high voltage alternating current power supply 44. This power supply 44 is connected to a conductor on the inner surface of the transducer and to one of the electrodes of the pair along the central axis. The electrical charge and/or field generated by such a supply enhances the operation of the SASER. In the case where bubbles generated by hydrolysis or otherwise are used as scattering nuclei, the bubbles tend to coalesce into sizes that exceed the bubble's resonant size. Such bubbles create two problems. One problem is that the oversized bubbles resonate at frequencies that are both different from the smaller bubbles and that exceed the working frequency of the SASER. Such energy is at best wasted because it will not coherently constructively add to the desired wave emission. Second, these bubbles will also gather at the antinodes, creating a change in the distribution of the index of refraction in the active medium along the longitudinal axis. This also works to decouple or destroy the coherence of the desired output wave.

By providing a supply of alternating current across the medium by high voltage supply 44, larger bubbles are broken up, minimizing the foregoing problem. Moreover, if an electrolyte is added to the active medium, an electric double layer will be formed around each bubble generated by the pulse generator. The bubbles will naturally repel each other, minimizing or eliminating coalescence. The pH of the solution may be controlled to control the charge carried by the bubbles. Where the active medium is nonconducting, the supply 44 will still create an electric field, causing any larger bubbles to elongate, distort, and break into smaller bubbles. The intensity of the field will determine the maximum size of the bubbles.

A similar phenomenon aids in maintaining separation for plastic particulates used as scattering nuclei. In a conductive active medium, especially if an electrolyte is added, the particles will carry like charges preventing them from agglomerating and maintaining a fairly even distribution in the vicinity of the antinodes. The pH may be adjusted in view of the medium and the substance of which the particulate is made. Where the active medium is nonconducting, the imposed electric field will create the desired charge on the nuclei.

It is also preferred that, in the case where the scattering nuclei are particulates such as hollow microspheres, the scattering nuclei have at least a slight positive buoyancy with respect to the active medium. This aids in keeping the nuclei suspended in the medium and facilitates their moving to the appropriate positions within the central cavity.

For each instance discussed above, the power supply should be an alternating current. This prevents the bubbles or particulates from adhering to or drifting towards one or the other of the electrical poles, that is, one of the pair of electrodes or the inner surface of the transducer.

An alternative means of providing scatterers, as opposed to generating bubbles internally of the central cavity or utilizing particulates in an otherwise isolated medium, is shown in FIG. 6 and the accompanying text. The nuclei distributor exemplified therein will have a small to negligible effect on the generation of the "sased" acoustic energy, but permits the constant introduction of scattering nuclei. At the same time, it aids in the removal of nuclei that are deleterious to the process. Bubbles that have coalesced into larger bubbles are drawn out of the medium and replaced with created bubbles of the desired size. Particulate scatterers that have collapsed or broken under the high stresses of the acoustic cavity will also be drawn out. An appropriate filter in the conduit providing the scatterers can be used to segregate useful scatterers for re-use.

An alternative method of converting the radially generated acoustic waves to axial energy can be used. As is described above, the central cavity of the SASER can be divided into longitudinal segments through the use of acoustically transparent membranes. These membranes may be of any suitable material, and may be semi-reflecting if desired. For this embodiment of the invention, the membranes are chemically impermeable. This allows the use of two or more, or alternating active media in the central cavity. To achieve a sasing state, the longitudinal segments are constructed to each conform to a multiple of the half wave length of the driving, that is, the input resonance. The active media in each adjoining segment must be of differing density, such that the wave speeds of the acoustic energy is different for each pair of adjoining segments.

With this construction, each interface between a pair of segments acts as a scatterer. The scattering in this case is a planar scattering, as opposed to the scattering achieved with particulate nuclei. It has been shown that this will result in the axial propagation of coherent, amplified acoustic energy, achieving the sasing condition.

In addition to creating, and enabling the use of, concentrated and directional acoustic energy, a SASER also allows an increase in the energy of the produced pressure wave. Ordinary flat plate transducers used in ultrasonic applications are generally limited to energy densities of only a few watts/cm$^2$. The SASER creates the potential for increasing this by an order of magnitude or more.

The disclosed SASER also allows variations in materials depending on the application. The transducing materials, as stated, are preferred to be piezoelectric or magnetostrictive, but are not limited thereto. Magnetostrictive materials are most useful for applications utilizing frequencies of under about 10 kHz, while piezoceramics are useful at these and higher frequencies. Other materials may be best suited for particular frequencies, uses, and/or environments.

Variations are also possible in the active medium. The discussion of the preferred embodiments is directed to liquid and particularly aqueous media. Other media may be useful. Different uses and environments may make the use of more or less dense media more efficient. Other variations are possible as is known to those of skill in the art.

The uses of concentrated, coherent, and highly directed acoustical beams such as those available through use of the claimed invention are many. With an appropriate housing, a SASER could be immersed in a relatively hostile environment, such as the interior of a reactor tank or containment vessel, and used to clean interior surfaces and/or to pulverize solids such as scale. The desired cavitation would be highly concentrated and would occur only in the desired direction. Moreover, the overall energy use is more efficient, and a cleaning task can be accomplished without exciting the entire medium contained within the vessel.

Another contemplated use is in underwater applications such as communications and sonar. Again, the increased efficiency and power transduction would greatly increase the range of such a device. The high directionality of the produced acoustic energy has obvious security advantages and the coherence of the emitted pressure wave will improve accuracy.

Another possible use is in sonochemistry. An acoustic SASER will find many uses in inducing reactions that might better go forward under conditions of carefully controlled frequency and energy. Also, where constituents are, or are being, separated, a SASER can be used to direct acoustic energy to only a desired portion of a separation or settling zone. This would produce the desired effect in only that portion or zone, with other zones being unaffected.

Wide variations in the materials, exact construction, and specific uses of SASERs built according to the disclosed invention are possible. The exact embodiments described here are intended as exemplary rather than limiting. The scope of the disclosed invention is as set forth in the following claims.

What is claimed is:

1. Acoustic apparatus for emitting coherent acoustical energy, said apparatus comprising:

a housing having an opening;

a hollow cylindrical transducer mounted in said housing, said transducer having a first end and a second end, said first end aligned with said opening, said transducer having an inner surface and an outer surface;

a rigid wall closing said second end of said transducer;

an acoustically conductive active medium filling said transducer; and a tunable power supply operatively connected to said transducer and capable of exciting said transducer to create acoustical energy in said active medium;

whereby coherent acoustical energy is emitted from said first end of said transducer through said opening in said housing.

2. The apparatus of claim 1, further comprising scattering nuclei in said active medium.

3. Acoustic apparatus comprising:

a housing having an opening;

a hollow cylindrical transducer mounted in said housing, said transducer having a first end and a second end, said first end aligned with said opening, said transducer having an inner surface and an outer surface;

at least one pair of electrodes mounted within said transducer substantially along a central longitudinal axis thereof, said electrodes operatively connected to a power source;

a rigid wall closing said second end of said transducer;

an acoustically conductive active medium filling said transducer;

a tunable power supply operatively connected to said transducer and capable of exciting said transducer to create acoustical energy in said active medium.

4. The apparatus of claim 3, further comprising at least one electrical conductor adhered to said inner surface of said transducer and a high voltage alternating current power supply operatively connected between one of the electrodes of said at least one pair of electrodes and said at least one conductor.

5. The apparatus of claim 3, wherein said transducer comprises a material selected from the group consisting of piezoelectric material and magnetostrictive material.

6. The apparatus of claim 3, wherein said transducer is constructed of a material selected from the group consisting of $PbZrTiO_2$, barium titanate, and quartz.

7. The apparatus of claim 3, wherein the frequency induced by said power supply and the longitudinal dimension of said transducer are selected such that said longitudinal dimension is a half multiple of said frequency.

8. The apparatus of claim 3, wherein said transducer is mounted in said housing such that said transducer is surrounded by an annular space.

9. The apparatus of claim 8, wherein said annular space is filled with an acoustical insulator.

10. Apparatus for producing concentrated coherent acoustical waves comprising:

a housing having an interior volume and an opening between said volume and the exterior of said housing;

a cylindrical acoustical transducer element mounted in said volume, said element comprising:

a tube having a first end aligned with said opening and a second end closed by an acoustically rigid wall;

a plurality of arcuate transducing sectors, each of said sectors comprising an outer portion, an inner portion in acoustical contact with said tube, and a transducing layer sandwiched between said inner portion and said outer portion, each sector having a predetermined length and a generally wedge-shaped cross-section; and an acoustically conductive active medium filling said tube, said active medium comprising an acoustically conductive fluid and scattering nuclei; and a high frequency power supply operatively connected to said transducing layer in each of said plurality of arcuate transducing sectors.

11. The apparatus of claim 10, wherein said cylindrical acoustical transducer element comprises:

a hollow inner slotted cylinder defining a tubular interior and having an exterior surface, said exterior surface having a plurality of first radially aligned slots;

a plurality of arcuate transducing elements, each of said elements attached to said exterior surface;

an outer slotted cylinder defining a mating interior and an exterior, said mating interior having a plurality of second radially aligned slots, said second radially aligned slots being disposed around said mating interior to line up with respective ones of said first radially aligned slots; and an acoustically conductive active medium in said tubular interior;

and wherein said power supply is operatively connected to each of said transducing elements to energize said transducing elements to create acoustical waves.

12. The apparatus of claim 10, wherein said first end of said tube is closed by an acoustically transparent diaphragm.

13. The apparatus of claim 10, wherein an electrode is mounted in said tube to extend substantially along the longitudinal axis thereof;

said tube has an electrically conductive material on the interior surface thereof; and a source of alternating current is operatively connected between said electrode and said electrically conductive material on the interior surface of said tube.

14. The apparatus of claim 11, further comprising scattering nuclei contained in said active medium, said scattering nuclei being selected from the group consisting of gas bubbles and compressible particulates.

15. The apparatus of claim 11, wherein said slots penetrate said thick-walled hollow inner slotted cylinder to a distance from said tubular interior that is equal to one quarter of said predetermined wavelength.

16. The apparatus of claim 10, wherein each said transducing layer is formed of material selected from the group consisting of piezoelectric materials and magnetostrictive materials.

17. The apparatus of claim 10, wherein said transducer element further comprises:

at least one band clamp surrounding said arcuate transducing sectors and exerting a substantially radially inward pressure to urge said arcuate transducing sectors against said tube.

18. A method of producing concentrated coherent acoustical waves, said method comprising:

providing a tube having a first end and a second end, said first end acoustically open and said second end closed by an acoustically rigid wall;

filling said tube with an acoustic active medium comprising an acoustically conductive fluid and scattering nuclei;

surrounding said tube with acoustic insulation; and causing said tube to vibrate radially.

19. The method of claim 18, wherein said scattering nuclei are hydrolytically produced gas bubbles.

20. The method of claim 18, wherein said scattering nuclei are provided to said active medium from a source external to said tube.

21. The method of claim 18, wherein said scattering nuclei are hollow microspheres.

22. Acoustic apparatus for emitting coherent acoustical energy, said apparatus comprising:

a housing having an opening;

a hollow cylindrical piezoelectric transducer mounted in said housing, said transducer having a first end and a second end, said first end aligned with said opening, said transducer having an inner surface and an outer surface;

an acoustically rigid wall closing said second end of said transducer;

an acoustically conductive active medium filling said transducer; and a tunable power supply operatively connected to said transducer and capable of energizing said transducer to generate acoustical energy in said active medium;

whereby, upon energizing said transducer, coherent acoustical energy is emitted from said first end of said transducer.

* * * * *